(12) United States Patent
Davies

(10) Patent No.: US 10,379,149 B2
(45) Date of Patent: Aug. 13, 2019

(54) SYSTEM AND METHOD FOR DETECTING CONNECTOR FAULTS IN POWER CONVERSION SYSTEM

(71) Applicant: Kevin Stephen Davies, Duncraig (AU)

(72) Inventor: Kevin Stephen Davies, Duncraig (AU)

( * ) Notice: Subject to any disclaimer, the term of this patent is extended or adjusted under 35 U.S.C. 154(b) by 261 days.

(21) Appl. No.: 15/316,510

(22) PCT Filed: Jun. 5, 2015

(86) PCT No.: PCT/AU2015/050313
§ 371 (c)(1),
(2) Date: Dec. 5, 2016

(87) PCT Pub. No.: WO2015/184511
PCT Pub. Date: Dec. 10, 2015

(65) Prior Publication Data
US 2017/0199236 A1     Jul. 13, 2017

(30) Foreign Application Priority Data

Jun. 5, 2014  (AU) ................................ 2014902224

(51) Int. Cl.
| | | |
|---|---|---|
| *H02J 1/10* | (2006.01) | |
| *H02J 3/38* | (2006.01) | |
| *G01R 31/02* | (2006.01) | |
| *H02S 50/00* | (2014.01) | |
| *H02S 50/10* | (2014.01) | |

(Continued)

(52) U.S. Cl.
CPC ........... *G01R 31/025* (2013.01); *G01R 31/40* (2013.01); *H02J 3/14* (2013.01); *H02J 3/383* (2013.01); *H02J 3/46* (2013.01); *H02J 7/007* (2013.01); *H02J 13/0062* (2013.01); *H02S 50/00* (2013.01); *H02S 50/10* (2014.12); *H02J 7/345* (2013.01)

(58) Field of Classification Search
CPC ... G01R 31/025; G01R 31/40; H02J 13/0062; H02J 3/46; H02J 7/007; H02J 3/14; H02J 3/383; H02J 7/345; H02S 50/10; H02S 50/00
USPC .......................................................... 307/52
See application file for complete search history.

(56) References Cited

U.S. PATENT DOCUMENTS

| | | | |
|---|---|---|---|
| 2006/0162772 A1* | 7/2006 | Presher, Jr. ............... | H02J 7/35 136/251 |
| 2010/0085670 A1* | 4/2010 | Palaniswami ............ | H02H 7/20 361/42 |

* cited by examiner

*Primary Examiner* — Richard Tan
(74) *Attorney, Agent, or Firm* — Tope-McKay & Associates

(57) ABSTRACT

A system and method for detecting connector (20) faults in a power conversion system (10). The system (10) comprises a plurality of series of modules (14) operable in a power conversion mode. A loop connection (30) is provided between the output of a final module (14) in the series and a first module (14) in the series and a loop switch (RL3) is provided in the loop connection (30). Loop current circuitry is provided in one or more of the modules (14) to generate a current flow within the loop and voltage measurement circuitry within each of the modules measures voltage of the input of the module relative to a local reference voltage and/or the output of the module relative to a local reference voltage. A control unit compares the voltages measured for the input and/or output of each of the modules against the voltages measured for the output and/or input of the adjacent modules to determine the resistance of the connection contacts between the module and the adjacent modules.

39 Claims, 4 Drawing Sheets

(51) Int. Cl.
*G01R 31/40* (2014.01)
*H02J 3/14* (2006.01)
*H02J 3/46* (2006.01)
*H02J 7/00* (2006.01)
*H02J 13/00* (2006.01)
*H02J 7/34* (2006.01)

SYSTEM AND METHOD FOR DETECTING CONNECTOR FAULTS IN POWER CONVERSION SYSTEM

FIELD OF THE INVENTION

The present invention relates to a system and method for detecting faults in connectors of a power conversion system.

BACKGROUND TO THE INVENTION

There are a number of applications in which conversion is required between DC power and AC power. The applicant's earlier International patents, published under numbers WO2012/016285 and WO2013/023248, describe such systems having improved methods of performing this conversion.

The systems described provide for creation of an AC signal suitable for power supply, or injection into mains power from DC sources consisting of a string of modules each connected to a DC power source. The modules are switched in an out of series in order to form a stepwise approximation of an AC signal and further compensation is performed to allow the signal to more closely resemble a desired AC signal.

Such systems rely on connectors to safely and efficiently carry high currents between modules. Solder joints, crimps and connection of connector pins can lead to failures that are hard to detect before breakdown occurs and difficult to locate after partial or total failure. Due to the series connected nature of such systems, identifying the location of intermittent faults may be problematic.

It is therefore desirable to provide a method for detection of faults within the connectors of such series connected power conversion systems.

SUMMARY OF THE INVENTION

According to one aspect of the present invention there is provided a system for detecting connector faults in a power conversion system comprising a plurality of series connected modules, each module having an input and an output connected by a connection contact, the system comprising:
a loop connection provided between the output of a final module in the series and a first module in the series;
a loop switch provided in the loop connection;
a control unit in communication with each of the modules to control operation of the modules during a power conversion mode;
loop current circuitry provided in one or more of the modules to generate a current flow from the output of the module; and
voltage measurement circuitry within each of the modules provided to measure voltage of the input of the module relative to a local reference voltage and/or the output of the module relative to a local reference voltage;
wherein the control unit is in communication with the loop switch, the loop current circuitry and the voltage measurement circuitry such that the control unit can dose the loop switch when the system is not in power conversion operation, control the loop current circuitry to generate the loop current and receive information from the voltage measurement circuitry of two or more of the modules whereby the control unit compares the voltages measured for the input and/or output of each of the modules against the voltages measured for the output and/or input of the adjacent modules to determine the resistance of the connection contacts between the module and the adjacent modules.

Preferably isolation switches are provided to disconnect the system inputs while the loop current is generated.

In a preferred embodiment, the loop current circuitry comprises switching devices operable to receive power from storage devices within the module in a manner which creates a controlled current from the output of the module.

Preferably the module includes a current sensor to control the level of the loop current and the switching devices comprise a switching regulator to create a voltage that pushes current around the loop.

In one embodiment, the voltage measurement circuitry comprises a processor provided within each of the modules in communication with the control unit.

In one embodiment, the loop current circuitry generates a plurality of currents of different values and the voltage measuring circuitry measures corresponding voltage values to be analysed by the control unit.

Preferably, multiple voltage measurements are communicated to the control unit and the control unit averages the readings to estimate resistance of the connection contacts.

In one embodiment, the modules comprise power modules having power sources and a compensator module, wherein storage devices within the power modules are switched into and out of the series connection during a power conversion mode to generate a stepwise approximation of an AC signal and the compensator module modifies the stepwise signal to more closely approximate a desired AC signal and wherein the loop connection, loop switch and loop current circuitry are contained within the compensator module.

In a preferred embodiment, the inputs and outputs of each of the modules comprise n contacts provided on wires extending from the modules.

Preferably the control unit uses information regarding characteristics of the wires to estimate wire resistance, the wire resistance being used to more accurately determine the resistance of the connection contacts.

In one embodiment, the system further comprises:
return inputs and outputs on each module such that generated loop current flows along the modules through the inputs and outputs in one direction and in an opposite direction through the return inputs and outputs:
a first input wire extending to the first input and a first output wire extending from the first output;
a second input wire extending to the return, input and a second output wire extending from the return output;
a first connection contact to connect the first output wire of each module with the first input wire of an adjacent module and a second connection contact to connect the second output wire of each module with the second input wire of an adjacent module;
input and the return output and the voltage across the output and the return input and the control unit compares the measured voltages to determine the combined resistance of the first and second connection contacts.

In a further embodiment, the output of the final module is connected directly back to the input of the first module and an earth switch is provided to connect an earth to a local reference point in the module containing the loop current circuitry, and wherein the voltage measurement circuitry of each of the modules measures the voltage between each of the inputs and/or outputs relative to a common earth voltage such that the control unit estimates the resistance of the connection contact between the input and/or output of each module and the output and/or input of adjacent modules.

Preferably the loop, current circuitry unit ramps the loop current to a predetermined maximum then ramps down again and each module monitors the voltage measurements from the voltage measurement circuitry, storing the average time that an LSB changes and its value such that the control unit extrapolates the data to generate a more accurate voltage measurement.

Preferably the data is compared against one or more of previous readings and variability of ADC step size and capacitor charging and discharging time constants are averaged out and wire resistance is taken into account to attain a better estimate of connection resistance.

The control unit may be provided with an alert device to provide a visual and/or audible indication that the estimated resistance within one of the connectors has exceeded an acceptable level.

Preferably the control unit includes current conditioning by intermittently increasing loop current while measuring connection contact resistance to a point where resistance of the connection contacts drops due to tunneling, fusing, or other phenomenon.

In one embodiment, the loop current generated is ramped and/or increased in steps and the loop current is increased to a level over the designed nominal maximum current of the connectors.

Loop currents of increasing magnitude with ramps may be utilized for conditioning. The loop current may be stewed continuously up and down over a range. Conditioning may also comprise circulating pulses of energy.

In accordance with a second aspect of the present invention, there is provided a method for detecting connector faults in a power conversion system comprising a plurality of series connected modules, each module having an input and an output such that the output of each of the modules is connected to the input of a subsequent module by a connection contact, the method comprising the steps of:
closing a loop switch such that the output of a final module in the series is connected to an input of a first module in the series when the power conversion system is not in a power conversion mode;
generating a loop current to flow through each of the modules via the loop switch;
measuring voltages between the input of the module and a local reference voltage, and/or the output of the module relative to a local reference voltage;
receiving information regarding the measured voltages in each of the modules in a control unit;
comparing within the control unit the voltages measured for the input and output of each of the modules again the voltages measured for the output and input of the adjacent modules to determine the resistance of the connection contacts between each of the modules and the adjacent modules.

Preferably the method comprises the further step of disconnect the system inputs while the loop current is generated.

Preferably the switching devices receive power from the storage devices within the module in a manner which creates the loop current.

Preferably the level of the loop current is controlled by a current sensor and switching devices are controlled to operate as a switching regulator to create a voltage that pushes current around the loop.

Preferably the method includes the step of performing the voltage measurements within a processor provided within each of the modules.

In one embodiment, the loop current circuitry generates a plurality currents of different values and the voltage measuring circuitry measures corresponding voltage values to be analysed by the control unit.

In one embodiment, the method includes the steps of communicating multiple voltage measurements to the control unit and averaging the readings in the control unit to estimate resistance of the connection contacts.

In one embodiment, the modules comprise power modules having power sources and a compensator module, wherein the loop current is generated by the compensator module.

The method may include the step of the control unit using information regarding characteristics of wires extending from the modules to estimate wire resistance, the wire resistance being used to more accurately determine the resistance of the connection contacts.

Preferably the voltage measurement circuitry measures the voltage between the input and a return output and/or the voltage across the output and a return input and wherein the control unit compares the measured voltages to determine the combined resistance of first and second connection contacts provided between the input and return output and between the output and return input.

Preferably the voltage measurement circuitry of each of the modules measures the voltage between each of the inputs and/or outputs relative to a common earth such that the control unit estimates the resistance of the connection contact between the input and/or output of each module and the output and/or input of adjacent modules.

Preferably the loop current circuitry unit ramps the loop current to a predetermined maximum then ramps down again and each module monitors the voltage measurements from the voltage measurement circuitry, storing the average time that an LSB changes and its value such that the control unit extrapolates the data to generate a more accurate voltage measurement.

In one embodiment, the data is compared against one or more of previous readings and variability of ADC step size and capacitor charging and discharging time constants are averaged out and wire resistance is taken into account to attain a better estimate of connection resistance.

Preferably the control unit performs current conditioning by intermittently increasing loop current while measuring connection contact resistance to a point where resistance of the connection contacts drops due to tunneling, fusing, or other phenomenon.

Preferably the loop current generated is ramped and/or increased in steps and the loop current is increased to a level over the designed nominal maximum current of the connectors.

BRIEF DESCRIPTION OF THE DRAWINGS

The invention will now be described, by way of example, with reference to the following drawings, in which.

DETAILED DESCRIPTION OF PREFERRED EMBODIMENTS

Figure 1:
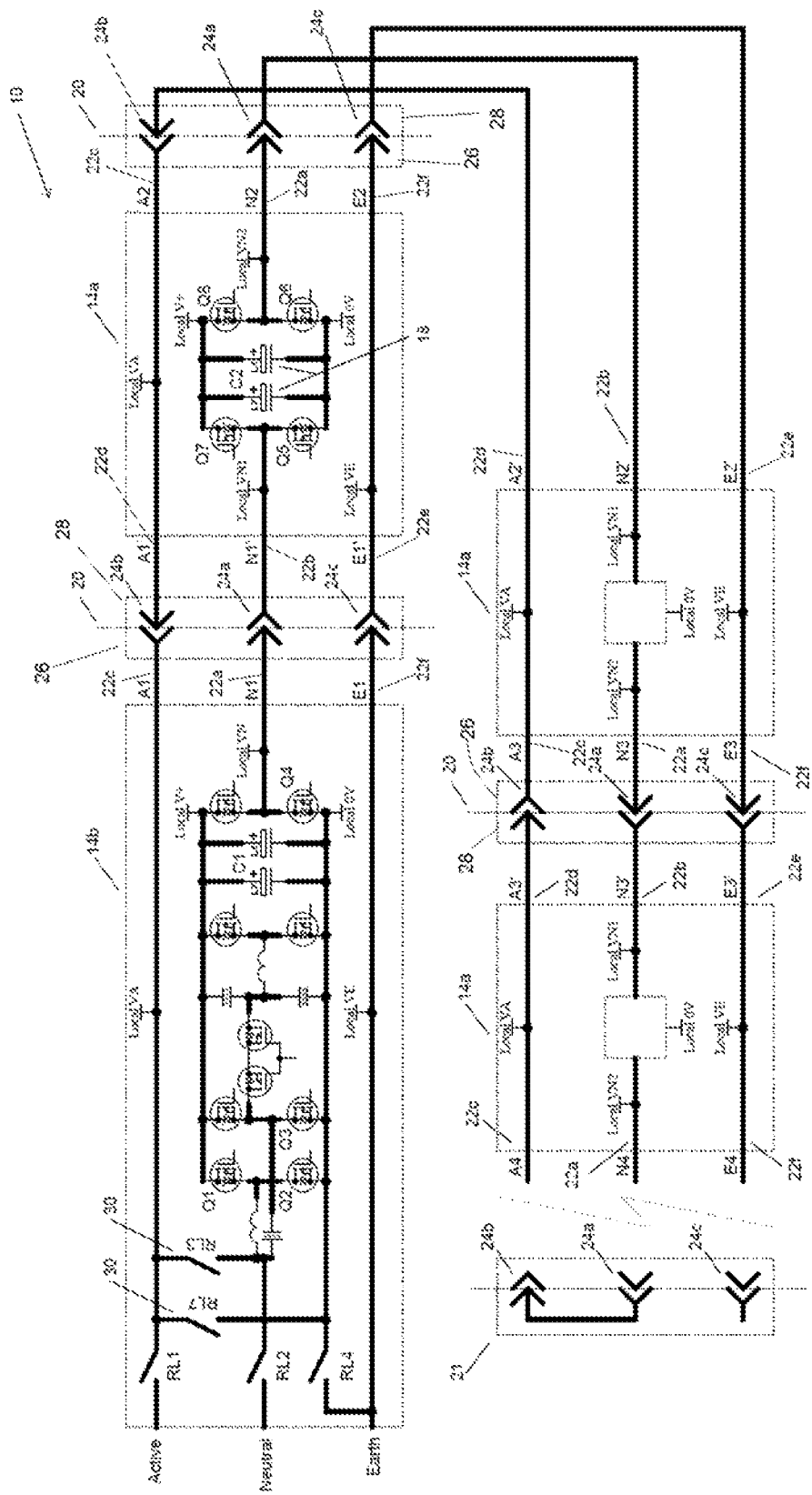
FIG. 1 is a schematic of a power conversion system comprising a plurality of series connected modules to which the present invention is applied.

The power conversion system 10 is generally of the type described in the applicants earlier International patent applications WO2012/018285 and WO2013/023248. FIG. 1 is a schematic of an improved version of such a power conversion system 10 to which the system and method of the present invention may be applied.

The power conversion system 10 includes a plurality of power modules 14a each associated with at least one power source. The power sources may be, for example, solar panels or batteries. Each of the power modules 14a is also provided with a storage device 18 connected to the terminals of the power source. The storage devices in one form may comprise capacitors 18, as shown for example in one of the power modules 14a. The storage devices 18 store charge from the power source such that when the power module 14a is bypassed, power generated by the power source continues to be, stored in the storage device 18 for use. The storage device 18 may be separate from or part of the power source.

Each of these power modules 14a has an input and an output. DC voltage generated by the power sources can be supplied from the storage device 18 across the input and the output and the power modules 14a are to be connected in series such that the output of each power module 14a is connected to the input of a subsequent power module 14a. The power conversion system 10 can therefore, supply a voltage being the sum of the voltages provided across the inputs and outputs of all of the power modules 14a.

During power conversion mode, the storage devices 18 are switched between the input and the output of the power module 14a in forward or reverse directions or bypassed to vary the voltage applied by the power module 14a to system output. A control unit (not shown) causes switching of the storage devices 18 within each of the power modules 14a to create a stepwise approximation of an AC signal.

A compensator module 14b is also provided in series with the power modules 14a. The compensator module 14b provides further modification of the stepwise signal created by the series connected power modules 14a such that the signal generated by the power conversion system 10 more closely follows a desired AC signal. The operation of the compensator module 14b is not directly relevant to the operation of the current invention and will therefore not be described in detail.

Each of the modules 14 is provided with an input and an output. In the embodiment shown, the first module 14 in the series comprises the compensator module 14b. The input of the first module 14 in the series is connected in the embodiment shown to a neutral connection. The inputs of each of the modules 14 are designated in FIG. 1 as Nn' and the outputs designated Nn+1, with n increasing for each module 14. While only four modules 14 are shown in FIG. 1, it will be appreciated that any number of modules 14 may be used. In practice, it would be expected that a larger number of power modules 14a would be likely with the number being determined in a solar power system by the number of solar panels used and the total power of the system.

Between each of the modules 14 is provided a connector 20. The connectors 20 connect wires extending between adjacent modules 14. The connectors 20 contain one or more connection contacts 24 for connecting each of the wires 22 from a module 14 with the corresponding wire 22 from the adjacent module 14. The wires 22 may comprise separate cables extending from the modules 14 to a connector. Alternatively, the connectors 20 may be secured to a circuit board forming part of the module 14 and the wires 22 comprise conductors provided on the circuit board.

The output of each of the modules 14 is connected to a first output wire 22a. The first output wire 22a is connected to a first input wire 22b of the subsequent module 14 by a first connection contact 24a.

The system 10 provides voltage between the neutral and active connections as shown in FIG. 1 and the output of the final module 14 in the series is therefore connected back to the active connection. The connection is provided back through the modules 14 in the embodiment of FIG. 1. Each of the modules 14 is therefore provided with a return input and a return output. The return output of each module 14 is designated An' and the return input is designated An+1 in FIG. 1. The return input of each module 14 is connected internally through the module 14 to the return output of the module 14

The return output is provided with a second output wire 22d and a second input wire 22c. The second output wire 22d of each of the modules 14 is connectable to the second input wire 22c of the adjacent module 14 by a second connection contact 24b. The first output wire 22a and the second input wire 22c would preferably be provide as adjacent wires forming part of a single connector cable and the first input wire 22b and second output wire 22d would also preferably be provided as adjacent wires forming part of single connector cable. The first and second connection contacts 24a and 24b would be formed within a single connection body of the connector 20, comprising a first portion 26 connected to the first output wire 22a and second input wire 22c and a second portion 28 connected to the first input wire 22b and second output wire 22d of the adjacent module 14.

An end connector 21 is provided to connect between the first output 22a and the second input 22c of the final module 14.

Each module 14 is provided further with an earth input and an earth output. In FIG. 1, the earth input of each module 14 is designated En' and the earth output designated En+1. The earth input is connected to the earth output within the module 14. A third input wire 22e is connected to the earth input and a third output wire 22f connected to the earth output. A third connection contact 24c connects between the earth output of each module 14 and the earth input of the subsequent module 14.

The third input wire 22e would preferably be provided as part of the single connector cable including the first input wire 22b and the second output wire 22d. The third output wire 22f would preferably be provided as part of the single connector cable including the first output wire 22a and the second input wire 22c The first, second and third connection contacts 24a, 24b and 24c would be formed within the single connection body of the connector 20 as described above. In this way, the adjacent modules 14 may be connected by securing together the first and second portion 26 and 28 of a connector 20.

The system 10 of the present invention is provided with a loop connection 30 having a loop switch. In the embodiment shown, the loop connection 30 is provided within the compensator module 14. The loop connection 30 provides a path between the return input A1 and output N1 of the compensator module 14b. The loop switch comprises switch RL3 or RL7.

The system 10 is provided also with isolation switches to disconnect the system 10 from the system inputs, in this case being the active and neutral Connections. The isolation switches comprise switches RL1 and RL2.

The system 10 is provided with a control unit (not shown). The control unit is connected to a control line that communicates information to each of the modules 14 in order to control operation of the modules 14. The control unit controls switching of the power modules 14a and the compensator module 14b during the power conversion mode to create the desired AC signal. The control unit also control operations of the loop switch RL3 and the isolation switches RL1 and RL2. The control unit may be located locally or may also be located remotely from the modules 14 and compensator unit 20.

The control unit is also in communication with power modules 14 and loop current circuitry provided within the system 10. The loop current circuitry comprises circuitry in one or more of the modules 14 to generate a voltage that causes current to flow in the loop created by the loop connection 30. In a preferred embodiment, the loop current circuitry is provided within the compensator module 14b. The compensator module closes Q4 and power modules 14 turn on their Q5 and Q6 connecting their first inputs Nn' to outputs Nn+1 to their 'Local 0V'. The loop current circuitry preferably comprises switching devices operable to switch storage devices 18 in a manner which creates a controlled current from the output of the compensator module 14b. The loop current is created when the loop switch is closed, the isolation switches are open and all modules 14 are bypassed having Q4, Q5 and Q6 turned on. That is, the system 10 is not in power conversion mode.

The loop current created by the loop current circuitry therefore flows through each of the modules 14 via the inputs and outputs and back to the compensator module 14b via the return inputs and outputs.

In the embodiment of FIG. 1, the compensator module 14b includes a current sensor (not shown) and a means to create current flow by pulsing Q1 or activating Q1/Q2 as a switching regulator to create a voltage that pushes current around the loop.

Each of the modules 14 of the system is provided with voltage measurement circuitry. The voltage measurement circuitry is provided to measure the voltage at the input and the output of each of the modules with reference to a local reference voltage. The voltage measurement circuitry may comprise a processor provided within each of the modules. The voltage measurement circuitry is in communication with the control unit such that the measured voltages may be transmitted to the control unit.

In the embodiment of FIG. 1, the voltage measurement circuitry measures the voltage between the input Nn' and the return output An'. That the voltage at Local VA relative to Local VN1 or vice versa. The voltage measurement circuitry also measures the voltage across the output Nn+1 and the return input An+1. That is the voltage at Local VA relative to cal VN2 or vice versa.

The measured voltages from each module 14 are transmitted to the control unit. The control unit compares the voltage measurements for the inputs and the outputs of each of the modules 14 to the voltage measurements for the outputs and inputs received from the adjacent modules 14 to determine the voltage drop across the connection contacts.

That is, the control unit compares the voltage across the input and the return output to the voltage across the output and return input of the previous module 14 to determine the voltage drop across the intervening connector 20 and associated wires. The control unit also compares the voltage across the output and the return input of the module to the voltage across the input and return output of the subsequent module 14 to determine the voltage drop across the intervening connector 20 and associated wires.

With information regarding the loop current generated and associated wires 22a-d, the control unit may therefore estimate the resistance of the connection contacts 24a and 24b. Connection contact resistances above certain values can provide an indication of a fault in the connector 20. In the embodiment of FIG. 1 the differences between the measured voltages will provide an indication of the combined resistance of the first and second connection contacts 24a and 24b. Individual resistances of the first and second connection contacts 24a and 24b are not necessary, as an increase in the value of the combined resistance beyond a certain value will indicate that at least one of the connection contacts is faulty and the whole connector 20 will require repair or replacement.

The system regularly performs the abovementioned connector tests. The tests can be scheduled to be performed every night or as certain temperatures are reached. Alternatively, the tests may be performed when the current has heated or stressed connectors for a while or when an anomaly is detected or before use each day or after service. The control unit is provided with an alert device to provide a visual and/or audible indication that the estimated resistance within one of the connectors has exceeded an acceptable level.

It is expected that the loop current circuitry will generate a plurality of currents of different values and the voltage measuring circuitry will measure corresponding voltage values to be analysed by the control unit.

Each module 14 is configured to measure static or varying voltages and voltage readings are taken on all modules 14 as the loop connector current is changed. The process is repeated with multiple voltage measurements being communicated to the control unit. Each measurement may consist of many voltage readings that are pre-processed by a module processor to provide an average or aggregated value that is communicated to the control unit. The control unit may then average the readings to estimate resistance of the connection contacts.

While the system has been described with reference to the loop current circuitry forming part of the compensator module 14b, it will be appreciated that other arrangements are possible. Some or all of the modules 14 could include current sensors and circuitry to generate particular voltages or loop currents.

Figure 2:
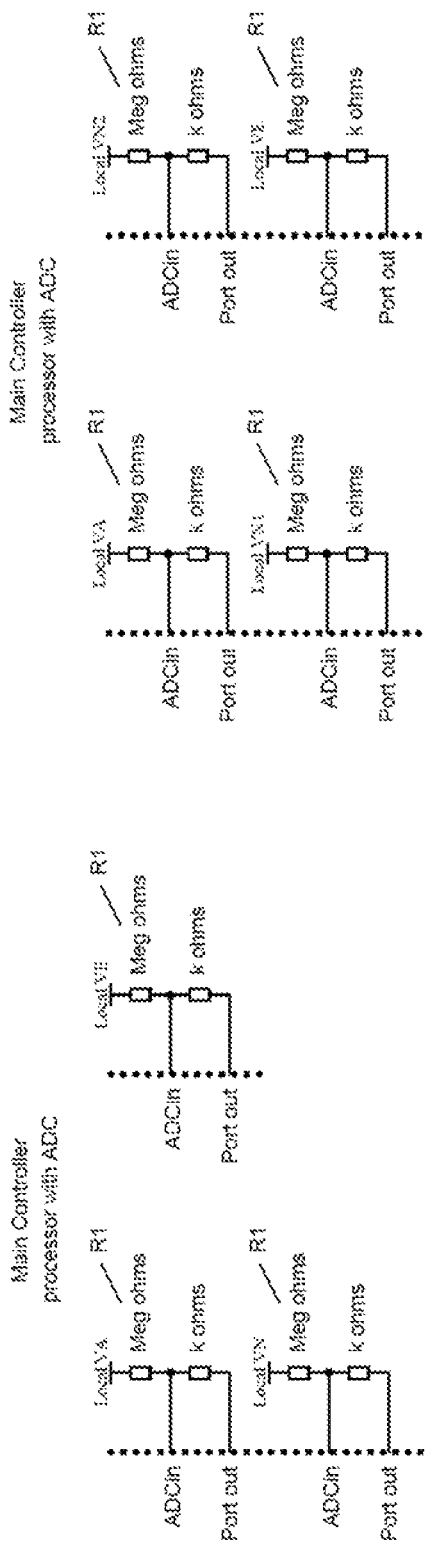
FIG. 2 comprises schematics of portions of processors contained within modules of the system for performing voltage measurements as part of the method of the present invention.

Referring to FIG. 2, an arrangement is shown that can both be used during operation and reconfigured to more accurately measure voltages that will be used when calculating connector resistances. "Port out" is enabled and pulled low for usual module operation enabling voltages much higher than the processor voltage to be read, R1 is in the order of Mega ohms enabling high voltages such as active to be measured.

"Port out" is tri-stated to increase the gain of the system when measuring connection resistances (there may be a high value resistor across 'Port out' to the positive power rail of a local processor or 'Local 0V of FIG. 1 to increase the sense range). Due to the high series resistances, leakage currents can dominate. To overcome this, readings are taken at multiple currents and differences in voltage readings considered. Alternatively or also, the main controller may pre-calibrate module 14 by first open circuiting Q4 and ramping or stepping the voltage on RL3 up and down while communicating calibration information to and/or from the modules.

Multiple readings are taken at each current or a moving average is used. A mode is also provided in which the large electrolytic capacitors C1 of the compensator module 14b are charged slower than the power required to do testing and the same capacitors provide power for testing. In this mode, tests are spread over multiple charge cycles collated over many measurement events and analysed later or as subsequent updated readings become available.

A typical connection resistance of 0.2 mΩ develops 10 mV with a current of 50 A. This equates to about 12.5 LSB of a 12 bit ADC having full scale span of 3.3V. Wire resistance dominates with around 4.2 mΩ (210 mV, 260 LSB) for a 1 m length of 4 mm$^2$ copper.

For better connection resistance calculation, the control unit utilises the temperatures recorded around the time the voltage measurements are taken. The expected resistance associated with the wire 22 at the measured temperature is subtracted from the readings to obtain an estimation of the actual connector resistance.

An alternative method for compensating for wire resistance is obtained by first calibrating all modules 14 against each other and/or the compensator module 14b. The modules also take voltage measurements and compare them against each other taking into account previously known lengths of wires 22 and previously saved calibration correction parameters such as an offset or scalar that gets applied as temperature change. The wire lengths can either be pre-programmed into the control unit on first installation or estimated from previous resistance measurements. Preferably the single connection cables are of predetermined lengths so that consistent wire resistances are used within the system. Extender cables may be used and made in set lengths.

An alternative method for measuring resistances that can use lower currents to provide suitably accurate readings is as follows. The loop current circuitry unit ramps current smoothly at say 100 mA per ms to a predetermined maximum then ramps down again. Ripple during the ramping is smoothed out by analogue filter and/or digitally. Each module (14) monitors the voltage measurements, storing the average time that each LSB changes and its new value. By extrapolating the readings and comparing against previous readings, variability of ADC step size, capacitor charging and discharging time constants and using information regarding wire resistance, inter-module comparisons and historical data, an estimated connection resistance is obtained.

Figure 4:
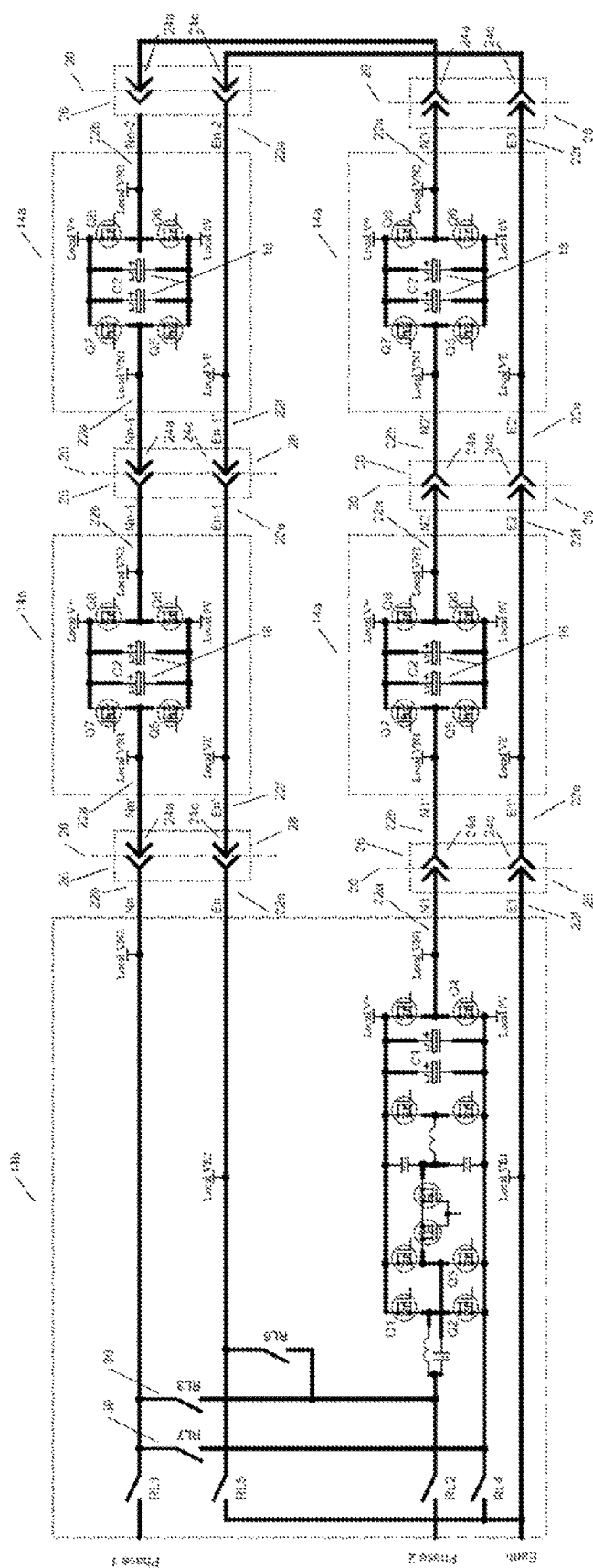
FIG. 4 is a schematic of a further power conversion system comprising a plurality of series connected modules, to which the present invention is applied.

FIG. 4 shows an alternative embodiment of a system 10 in accordance with the present invention. In the system of FIG. 4, the modules 14 are arranged such that final module 14 in the series is adjacent the first module 14, being in the embodiment shown the compensator 14b. The end connector 21 of FIG. 1 is therefore not required and the output of the final module 14a is connected directly back to the input of the compensator module 14b. Such an arrangement may be suitable, for example, in solar farms where it would be preferable to reduce the additional wiring required by absence of the separate return path.

The system 10 of FIG. 4 includes one or more earth switches. In the embodiment shown, there are provided first and second earth switches RL4 and RL5. The earth switches RL4 and RL5 in the embodiment shown connect either end of the earth line 'Local VE1', 'Local VE2' to the local reference point in the compensator module 14, being the local low reference voltage 'Local 0V'.

The invention with reference to the system of FIG. 4 operates in a similar manner to that described previously. The voltage measurement circuitry of each of the modules 14 measures the voltage between each of the inputs and outputs relative to the local low reference voltage. Each of the power modules 14 measures also the voltage difference between their 'Local 0V' and the local low reference voltage that is conducted up the earth wire to their "Local VE". The voltage measured for the inputs and outputs of each module 14 is corrected by this amount and the corrected voltage measurements for the inputs and outputs compared by the control unit to the corrected voltages for the outputs and inputs of adjacent modules 14 to determine the voltage drop, and hence resistance, across the connection contacts 24a.

The system described so far maybe used to estimate the resistance of connections 24a. After testing the connection 24a, the system proceeds to testing the connections 24c by first opening RL3, dosing RL6 and RL7 then opening RL5 and continues to keep module in bypass so that Q4, Q5 and Q6 remain on. Testing is done in a similar manner for testing 24a and 24c. RL7 is closed before RL5 is opened and at the end of the test RL5 is closed before RL7 is opened. Maintaining a closed circuit this way shorts induced currents from possible lightning strikes improving the reliability of the test system.

In one particular embodiment, it is expected that each of the wires 22 extending from the modules 14 comprises two physical cables. Each of the connection contacts 24 therefore comprises two physical connection contacts within one of the connectors 20. The methods remain the same for detecting high resistance connection contact.

A quick analysis shows:

a single 4 sq mm wire/connector system has a resistance change from 4.4 mR to 5.2 mR as its connector resistance increases from 0.2 mR to 1 mR.

a double 3 sq mm wire/double connector system has a resistance change from 5.8 mR in parallel with 5.8 mR to 5.8 mR in parallel with 6.6 mR as a single of its connectors increases from 0.2 mR to 1 mR.

5.8 mR in parallel with 5.8 mR gives 2.9 mR, 5.8 mR in parallel with 6.6 mR gives 3.1 mR.

A change from 2.9 to 3.1 mR is a variation of 7% and for a double system, the system raises an alert if such a change occurs.

A method is also provided which enables a fault to be detected from first installation, without the wire lengths being known. This method is also self-corrected to protect against temperature (wire resistance) and module calibrations. Referring to FIG. 1, open circuiting RL1, RL2 and closing RL4 connects the system to a wire (earth) that goes from one end of the system to the other and is used as a reference voltage. A connection to earth can also be used to create a SAFE shutdown state as the system is entirely disconnected from the mains and connected to Earth. The system performs the tests detailed above but at each step collects readings of the earth reference voltage and uses these readings to correct for differences in 'Local 0V' between modules and so accurately calculate the ratios of neutral/active connector voltage drops and hence resistance ratios of the connections. It can be seen that the wire resistances cancel out as the individual lengths of active/neutral are identical. It can also be seen the calibrations of modules cancel out where the ratios VA/VNx with reference to ratios from adjacent modules are used to determine when a connector goes high resistance.

The main controller measures 'Local VN' and 'Local VA' and uses these to estimate the connector resistance using the same methods described previously.

The system 10 may also be provided with a means for conditioning connection contacts. Connector resistances have been shown to decrease as current increases to a point where resistance suddenly drops due to tunneling, fusing, or some other phenomenon.

Connector conditioning comprises increasing current through the connectors 20 and performing resistance measurements for the connection contacts as described previously. The loop current generated is ramped and/or increased in steps. The estimated resistance measurements are utilized by the control unit to determine when sufficient conditioning of the connectors 20 has been achieved.

Conditioning may be employed after servicing, periodically, or when first installed. The process can be initiated but starting from low current and increasing with subsequent readings.

Figure 3A:
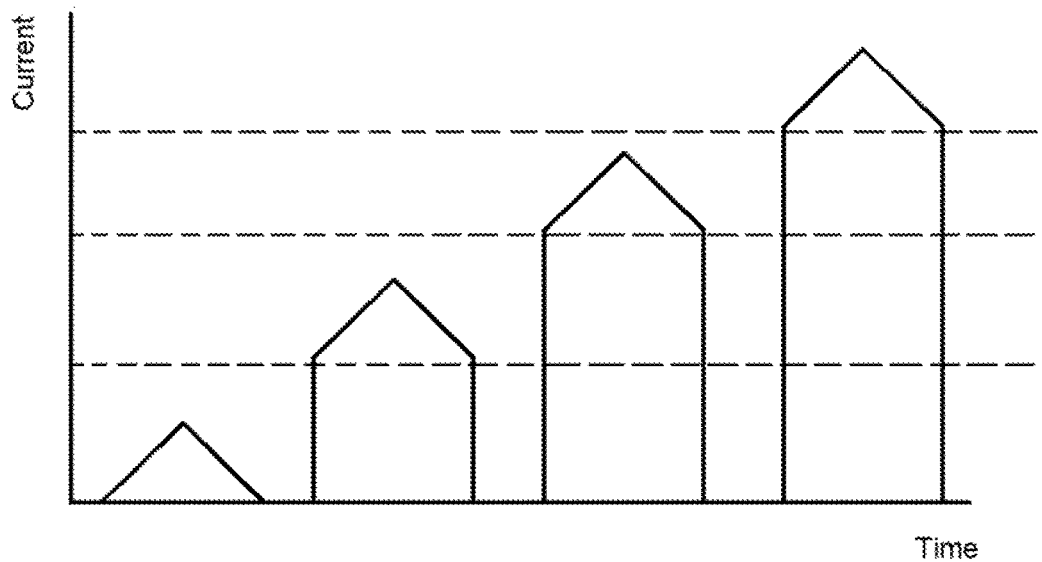
FIG. 3a is a graph of current increases used for both connector conditioning and precise current measurement.
Figure 3B:
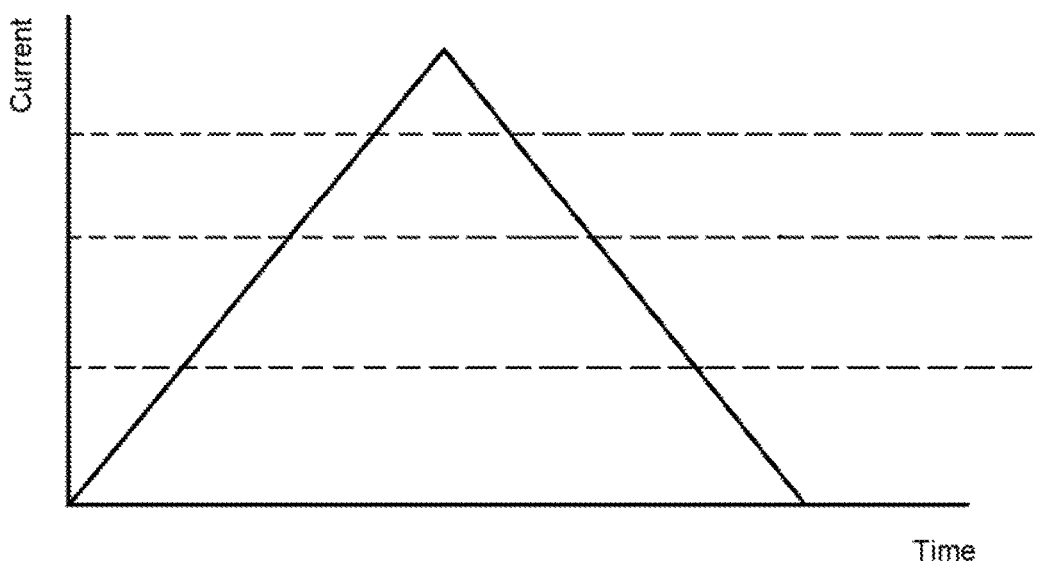
FIG. 3b is an alternative graph showing current ramping for both connector conditioning and precise current measurement.

The loop current during conditioning is expected to be increased to well over the designed nominal maximum current of the connectors so multiple parallel contact points can tunnel or fuse to decrease overall connection resistance. This is especially useful for double wire systems. Referring to FIG. 3a, four currents of increasing magnitude with ramps are shown for simplicity but for higher resolution, more would be used in practice. A slew current over a greater range such as that shown in FIG. 3b is also envisaged.

Alternatively pulses of energy are circulated. This is useful for double wire systems or where desired controlled currents exceed the capabilities of system. It is noted that for the systems described in the applicant's earlier international patents WO2012/016285 and WO2013/023248, the bypass FETs can cope with pulses of current exceeding 500 A and designs of such systems include parallel FETs to improve overall efficiency of the system. Therefore conditioning pulses of current could very much exceed the capabilities of the current control system without causing damage.

Pulses of energy rather than controlled loop current are used to provide higher current conditioning. Referring for example to C2, Q7 and Q8 of FIG. 1. In the implementations of the international patents WO2012/016285 and WO2013/023248, capacitor C2 is of the order 0.01 F. To create an energy pulse, the control unit causes two power modules 14a to charge their storage capacitors C2 to differing voltages. RL7 is closed during pulse energy reconditioning to bypass high currents around the circuit associated with Q1 to Q3. Before launching the current pulse, the control unit causes all modules 14a to disable their over current protection (over current protection causes them to leave bypass mode preventing the current flow on an over current event). To launch the energy/current pulse, the control unit causes the two modules 14a to switch in circuit at the same time in opposite directions by switching to Q7 or Q8 respectively. The size of the desired current pulse and total energy sent around the loop is then determine by how much the module voltages differed.

In the circuit of FIG. 4, RL3, RL6, RL5 and RL7 are swapped as described above to condition and test the earth connections 24c. RL5 or RL7 are also closed to produce a shorted alternate loop that reduces the inductance of the loop being tested enabling faster changing currents to be controlled around the loop and narrower conditioning energy/current pulses.

Voltage readings are rapidly taken as pulse reconditioning takes place. Curve fitting of the readings using convolution is done to provide scalars that relates to resulting voltages and connector conditions are determined from these scalars or from resistance measurements as described before. It is preferable not to condition connection too many times as this can lead to them becoming worn out. To reduce unnecessary conditioning pulses, correlation of the voltage reading against known good connection pulse shapes is used with the differences of correlation being used to determine where connections are likely to break down or to determine when subsequent reconditioning pulses are no longer required.

Resistance readings as the energy or currents are increased are saved for later comparison purposes or to report or graph. A simple graph would have overlaid lines showing each set of connectors with red for resistances outside pre-determined limits.

It will be readily apparent to persons skilled in the relevant arts that various modifications and improvements may be made to the foregoing embodiments, in addition to those already described, without departing from the basic inventive concepts of the present invention.

What is claimed is:

1. A system for detecting connector faults in a power conversion system comprising a plurality of series connected modules, each module having an input and an output connected by a connection contact, the system comprising:
   a loop connection provided between the output of a final module in the series and a first module in the series;
   a loop switch provided in the loop connection;
   a control unit in communication with each of the modules to control operation of the modules during a power conversion mode;
   loop current circuitry provided in one or more of the modules to generate a current flow from the output of the module; and
   voltage measurement circuitry within each of the modules provided to measure voltage of the input of the module relative to a local reference voltage and/or the output of the module relative to a local reference voltage;
   wherein the control unit is in communication with the loop switch, the loop current circuitry and the voltage measurement circuitry such that the control unit closes the loop switch when the system is not in power conversion operation, controls the loop current circuitry to generate the loop current and receives information from the voltage measurement circuitry of two or more of the modules, whereby the control unit compares the voltages measured for the input and/or output of each of the modules against the voltages measured for the output and/or input of the adjacent modules to determine the resistance of the connection contacts between the module and the adjacent modules.

2. The system in accordance with claim 1, wherein isolation switches are provided to disconnect system inputs while the loop current is generated.

3. The system in accordance with claim 2, wherein the loop current circuitry comprises switching devices operable to receive power from storage devices within the module in a manner which creates a controlled current from the output of the module.

4. The system in accordance with claim 3, wherein the module includes a current sensor to control the level of the loop current and the switching devices comprise a switching regulator to create a voltage that pushes current around the loop.

5. The system in accordance with claim 1, wherein the voltage measurement circuitry comprises a processor provided within each of the modules in communication with the control unit.

6. The system in accordance with claim 1, wherein the loop current circuitry generates a plurality of currents of different values and the voltage measuring circuitry measures corresponding voltage values to be analysed by the control unit.

7. The system in accordance with claim 6, wherein multiple voltage measurements are communicated to the control unit and the control unit averages the readings to estimate resistance of the connection contacts.

8. The system in accordance with claim 1, wherein the modules comprise power modules having power sources and a compensator module, wherein storage devices within the power modules are switched into and out of the series connection during a power conversion mode to generate a stepwise approximation of an AC signal and the compensator module modifies the stepwise signal to more closely approximate a desired AC signal and wherein the loop connection, loop switch and loop current circuitry are contained within the compensator module.

9. The system in accordance with claim 1, wherein the inputs and outputs of each of the modules comprise connection contacts provided on wires extending from the modules.

10. The system in accordance with claim 9, wherein the control unit uses information regarding characteristics of the wires to estimate wire resistance, the wire resistance being used to more accurately determine the resistance of the connection contacts.

11. The system in accordance with claim 9, further comprising:
return inputs and outputs on each module such that generated loop current flows along the modules through the inputs and outputs in one direction and in an opposite direction through the return inputs and outputs;
a first input wire extending to the first input and a first output wire extending from the first output;
a second input wire extending to the return input and a second output wire extending from the return output;
a first connection contact to connect the first output wire of each module with the first input wire of an adjacent module and a second connection contact to connect the second output wire of each module with the second input wire of an adjacent module;
wherein the voltage measurement circuitry measures the voltage between the input and the return output and the voltage across the output and the return input and the control unit compares the measured voltages to determine the combined resistance of the first and second connection contacts.

12. The system in accordance with claim 9, wherein the output of the final module is connected directly back to the input of the first module and an earth switch is provided to connect an earth to a local reference point in the module containing the loop current circuitry, and wherein the voltage measurement circuitry of each of the modules measures the voltage between each of the inputs and/or outputs relative to a common earth voltage such that the control unit estimates the resistance of the connection contact between the input and/or output of each module and the output and/or input of adjacent modules.

13. The system in accordance with claim 5, wherein the loop current circuitry unit ramps the loop current to a predetermined maximum then ramps down again and each module monitors the voltage measurements from the voltage measurement circuitry, storing the average time that an LSB changes and its value such that the control unit extrapolates the data to generate a more accurate voltage measurement.

14. The system in accordance with claim 13, wherein the data is compared against one or more of previous readings and variability of ADC step size and capacitor charging and discharging time constants are averaged out and wire resistance is taken into account to attain a better estimate of connection resistance.

15. The system in accordance with claim 1, wherein the control unit is provided with an alert device to provide a visual and/or audible indication that the estimated resistance within one of the connectors has exceeded an acceptable level.

16. The system in accordance with claim 1, wherein the control unit includes current conditioning by intermittently increasing loop current while measuring connection contact resistance to a point where resistance of the connection contacts drops due to tunneling, fusing, or other phenomenon.

17. The system in accordance with claim 16, wherein the loop current generated is ramped and/or increased in steps and the loop current is increased to a level over the designed nominal maximum current of the connectors.

18. The system in accordance with claim 17, wherein loop currents of increasing magnitude with ramps are utilized for conditioning.

19. The system in accordance with claim 17, where the loop current is slewed continuously up and down over a range.

20. The system in accordance with claim 17, wherein conditioning comprises circulating pulses of energy.

21. A method for detecting connector faults in a power conversion system comprising a plurality of series connected modules, each module having an input and an output such that the output of each of the modules is connected to the input of a subsequent module by a connection contact, the method comprising the steps of:
closing a loop switch such that the output of a final module in the series is connected to an input of a first module in the series when the power conversion system is not in a power conversion mode;
generating a loop current to flow through each of the modules via the loop switch;
measuring voltages between the input of the module and a local reference voltage and/or the output of the module relative to a local reference voltage;
receiving information regarding the measured voltages in each of the modules in a control unit;
comparing within the control unit the voltages measured for the input and output of each of the modules against the voltages measured for the output and input of the adjacent modules to determine the resistance of the connection contacts between each of the modules and the adjacent modules.

22. The method in accordance with claim 21, comprising the further step of disconnecting system inputs while the loop current is generated.

23. The method in accordance with claim 21, wherein the switching devices receive power from the storage devices within the module in a manner which creates the loop current.

24. The method in accordance with claim 23, wherein level of the loop current is controlled by a current sensor and switching devices are controlled to operate as a switching regulator to create a voltage that pushes current around the loop.

25. The method in accordance with claim 21, including the step of performing the voltage measurements within a processor provided within each of the modules.

26. The method in accordance with claim 21, wherein the loop current circuitry generates a plurality of currents of different values and the voltage measuring circuitry measures corresponding voltage values to be analysed by the control unit.

27. The method in accordance with claim 26, comprising the steps of communicating multiple voltage measurements to the control unit and averaging the readings in the control unit to estimate resistance of the connection contacts.

28. The method in accordance with claim 21, wherein the modules comprise power modules having power sources and a compensator module, wherein the loop current is generated by the compensator module.

29. The method in accordance with claim 21, comprising the step of the control unit using information regarding characteristics of wires extending from the modules to estimate wire resistance, the wire resistance being used to more accurately determine the resistance of the connection contacts.

30. The method in accordance with claim 29, wherein the voltage measurement circuitry measures the voltage between the input and a return output and/or the voltage across the output and a return input and wherein the control unit compares the measured voltages to determine the combined resistance of first and second connection contacts provided between the input and return output and between the output and return input.

31. The method in accordance with claim 30, wherein the voltage measurement circuitry of each of the modules measures the voltage between each of the inputs and/or outputs relative to a common earth such that the control unit estimates the resistance of the connection contact between the input and/or output of each module and the output and/or input of adjacent modules.

32. The method in accordance with claim 21, wherein the loop current circuitry unit ramps the loop current to a predetermined maximum then ramps down again and each module monitors the voltage measurements from the voltage measurement circuitry, storing the average time that an LSB changes and its value such that the control unit extrapolates the data to generate a more accurate voltage measurement.

33. The method in accordance with claim 31, wherein the data is compared against one or more of previous readings and variability of ADC step size and capacitor charging and discharging time constants are averaged out and wire resistance is taken into account to attain a better estimate of connection resistance.

34. The method in accordance with claim 21, wherein a visual and/or audible indication is provided that the estimated resistance within one of the connectors has exceeded an acceptable level.

35. The method in accordance with claim 21, wherein the control unit performs current conditioning by intermittently increasing loop current while measuring connection contact resistance to a point where resistance of the connection contacts drops due to tunneling, fusing, or other phenomenon.

36. The method in accordance with claim 35, wherein the loop current generated is ramped and/or increased in steps and the loop current is increased to a level over the designed nominal maximum current of the connectors.

37. The method in accordance with claim 36, wherein loop currents of increasing magnitude with ramps are utilized for conditioning.

38. The method in accordance with claim 37, where the loop current is slewed continuously up and down over a range.

39. The method in accordance with claim 38, wherein conditioning comprises circulating pulses of energy.

* * * * *